(12) United States Patent
Dyer et al.

(10) Patent No.: US 9,477,537 B2
(45) Date of Patent: Oct. 25, 2016

(54) REACTIVE COINCIDENCE

(75) Inventors: John Wesley Dyer, Monroe, WA (US); Jeffrey Van Gogh, Redmond, WA (US); Henricus Johannes Maria Meijer, Mercer Isand, WA (US); Bart De Smet, Bellevue, WA (US); Colin Joseph Meek, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 214 days.

(21) Appl. No.: 12/966,511

(22) Filed: Dec. 13, 2010

(65) Prior Publication Data

US 2012/0150514 A1 Jun. 14, 2012

(51) Int. Cl.
G06G 7/48 (2006.01)
G06F 9/54 (2006.01)
G06F 17/50 (2006.01)

(52) U.S. Cl.
CPC ........... *G06F 9/542* (2013.01); *G06F 17/5009* (2013.01)

(58) Field of Classification Search
CPC ...... G06F 9/542; G06F 9/46; G06F 11/3447; G06F 11/0721; G06F 17/30442; G06F 17/30979; G06Q 40/06; G06Q 30/02–30/0204; G06K 9/62
USPC ................................................. 703/17, 6, 21
See application file for complete search history.

(56) References Cited

U.S. PATENT DOCUMENTS

| | | | | |
|---|---|---|---|---|
| 5,299,257 A | * | 3/1994 | Fuller et al. | 379/100.05 |
| 6,408,404 B1 | * | 6/2002 | Ladwig | 714/39 |
| 6,839,680 B1 | * | 1/2005 | Liu et al. | 705/7.33 |
| 7,783,509 B1 | | 8/2010 | Shan et al. | |
| 7,990,262 B2 | * | 8/2011 | Weaver et al. | 340/539.1 |
| 8,010,592 B2 | * | 8/2011 | Albers | 709/201 |
| 8,122,006 B2 | * | 2/2012 | de Castro Alves et al. | 707/713 |
| 8,131,718 B2 | * | 3/2012 | Tran | 707/732 |
| 8,306,784 B2 | * | 11/2012 | Albers et al. | 702/186 |
| 8,433,725 B2 | * | 4/2013 | Yan et al. | 707/780 |
| 8,533,727 B2 | * | 9/2013 | Albers et al. | 718/104 |
| 8,676,841 B2 | * | 3/2014 | Srinivasan et al. | 707/780 |
| 2002/0143920 A1 | * | 10/2002 | Dev et al. | 709/223 |
| 2003/0120450 A1 | | 6/2003 | Ernst et al. | |
| 2006/0149849 A1 | * | 7/2006 | Raz | 709/231 |
| 2006/0282695 A1 | | 12/2006 | Mital et al. | |
| 2007/0150585 A1 | * | 6/2007 | Chkodrov | 709/224 |
| 2008/0016095 A1 | * | 1/2008 | Bhatnagar et al. | 707/101 |
| 2009/0089078 A1 | * | 4/2009 | Bursey | 705/1 |
| 2009/0125550 A1 | | 5/2009 | Barga et al. | |
| 2010/0088325 A1 | | 4/2010 | Goldstein et al. | |
| 2010/0131556 A1 | | 5/2010 | Meijer et al. | |

OTHER PUBLICATIONS

Demers et al, "A General Algebra and Implementation for Monitoring Event Streams", Cornell University, Jul. 7, 2005.*

(Continued)

*Primary Examiner* — Eunhee Kim

(74) *Attorney, Agent, or Firm* — Nicholas Chen; Kate Drakos; Micky Minhas

(57) ABSTRACT

An outer event stream can be modeled to represent duration for an event with an inner event stream. The inner event stream can be generated to represent duration of at least one event from the outer event stream. By modeling the outer event stream to include duration, coincidence between two or more events can be determined. More specifically, the modeling of the outer event stream enables use of operators to identify coincidence between events from event streams.

18 Claims, 9 Drawing Sheets

(56) References Cited

OTHER PUBLICATIONS

Kramer et al, "Semantics and Implementation of Continuous Sliding Window Queries over Data Streams", ATM Trans. Database Syst. 34, 1, Article 4, Apr. 2009.*
Demers et al, "Cayuga: A General Purpose Event Monitoring System", Cornell University, 2007.*
Yoneki et al, "Unified Semantics for Event Correlation Over Time and Space in Hybrid Network Environments", CoopIS/DOA/ODBASE 2005, LNCS 3760, pp. 366-384, 2005.*
Suntinger et al, "The Event Tunnel: Interactive Visualization of Complex Event Streams for Business Process Pattern Analysis", Technical Report, TR-186-2-07-07, May 2007.*
Rox et al, "Construction and Deconstruction of Hierarchical Event Streams with Multiple Hierarchical Layers", Euromicro Conference on Real-Time Systems, IEEE, 2008.*
Bose et al, "Data Stream Management for Historical XML Data", SIGMOD Jun. 13-18, 2008.*
Ladwig, Michael, PCT/US99/16789, published Feb. 10, 2000.*
Barga et al, "Consistent Streaming Through Time: A Vision for Event Stream Processing", 3rd Biennial Conference on Innovative Data Systems Research, Jan. 7-10, 2007.*
Li et al, "Interval Event Stream Processing", DEBS, Jul. 6-9, 2009.*
Allen, James, ("Maintaining Knowledge About Temporal Intervals", Communications of the ACM, vol. 26, No. 11, Nov. 1983.*
Ali et al, "Microsoft CEP Server and Online Behavioral Targeting", VLDB'09, Aug. 24-28, 2009.*
Welbourne et al, "Cascadia: A System for Specifying, Detecting, and Managing RFID Events", MobiSys'08, Jun. 17-20, 2008.*
White et al, "What is "Next" in Event Processing?", Proceedings of the 26th ACM SIGMOD-SIGACT-SIGART Symposium on Principles of Database Systems, 2007.*
Walzer et al, "Relative Temporal Constraints in the Rete Algorithm for Complex Event Detection", DEBS'08, Jul. 1-4, 2008.*
Yoneki et al, "Unified Semantics for Event Correlation over Time and Space in Hybrid Network Environments", LNCS 3760, pp. 366-384, Springer-Verlag Berlin Heidelberg 2005.*
Rattz, et al, "Pro LINQ Language Integrated Query in VB 2008", Chapter 4, pp. 93-175, Copyright 2009.*
Rox, et al., "A Modeling Event Stream Hierarchies with Hierarchical Event Models", Retrieved at << http://www.date-conference.com/proceedings/PAPERS/2008/DATE08/PDFFILES/04.6_2.PDF >>, 2008, pp. 6.
Albers, et al., Hierarchical Event Streams and Event Dependency Graphs: A New Computational Model for Embedded Real-Time Systems >>, Retrieved at << http://www.computer.org/portal/web/csdl/doi/10.1109/ECRTS.2006.12 >>, 2006, pp. 10.
Herreman, David, "Event Stream Intelligence with Esper and NEsper", Retrieved at << http://esper.codehaus.org/>>, 2006-2007, pp. 3.
"Event stream processing", Retrieved at << http://en.wikipedia.org/wiki/Event_stream_processing >>, Retrieved Date: Sep. 15, 2010 >>, pp. 2.
Albers, et al., "Advanced Hierarchical Event-Stream Model", Retrieved at << http://www.uni-ulm.de/fileadmin/website_uni_ulm/iui.inst.050/publications/ECRTS_08.pdf >>, 2008, pp. 211-220.
Jiang, et al., "Towards an Integrated Model for Event and Stream Processing", Retrieved at << http://citeseerx.ist.psu.edu/viewdoc/summary?doi=10.1.1.130.183 >>, Jan. 2007, pp. 35.
"International Search Report", Mailed Date: Jul. 30, 2012, Application No. PCT/US2011064505, Filed Date: Dec. 13, 2011, pp. 8.
Gennart, Benoit A.,"Comparative Design Validation Based on Event Pattern Mappings," 30th Design Automation Conference Jun. 14, 1993, pp. 8, Association for Computing Machinery.
"First Office Action," The State Intellectual Property Office of the People's Republic of China, Mailed Date: Dec. 10, 2013, Application No. 201110435584.1 Filed Date: Dec. 13, 2010, pp. 12.
"Response to First Office Action," The State Intellectual Property Office of the People's Republic of China, Application No. 201110435584.1, Filed Date: Apr. 25, 2014, pp. 10.
"Second Office Action," The State Intellectual Property Office of the People's Republic of China, Mailed Date: Aug. 4, 2014, Application No. 201110435584.1 Filed Date: Dec. 13, 2010, pp. 8.
"Summary of Text of Second Office Action," The State Intellectual Property Office of the People's Republic of China, Mailed Date: Aug. 4, 2014, Application No. 201110435584.1 Filed Date: Dec. 13, 2010, pp. 3.
"Supplementary European Search Report" European Patent Office, Mailed Date: May 30, 2014, Application No. 11848283.5 , pp. 7.
"Response to Supplementary European Search Report" European Patent Office, Mailed Date: Jul. 25, 2014, Application No. 11848283.5 , pp. 15.
"Office Action Issued in Australian Patent Application No. 2011344063", Mailed Date: Mar. 30, 2016, 3 Pages.
"Office Action Issued in Chinese Patent Application No. 201110435584.1", Mailed Date: Feb. 3, 2015, 7 Pages.

* cited by examiner

REACTIVE COINCIDENCE

BACKGROUND

Data sources can provide event streams to clients for further exploitation. For example, an event stream can include events corresponding to stock prices that are communicated via the event stream at arbitrary times, such as upon a change in price of a stock. Event streams and associated events are typically harnessed as data over which queries can be executed. Querying enables resources (e.g., software, servers, applications, hardware . . . ) to utilize the event streams and events. For instance, a particular stock price can be monitored and a user notified when the price reaches a certain value.

Conventional event streams comprise reactive streams of point events that occur at a specific point in time. It can be useful to include duration for each of the events to facilitate exploiting event streams and respective data. Typically, two techniques are employed to handle representing duration for events from event streams-utilizing an end of duration event or implementing a time stamp.

An end of duration event can be generated for each event on an event stream. Yet, such end of duration events are not directly correlated to corresponding events. In particular, the event stream of events can include a corresponding stream that includes end of duration events for each event on the event stream. However, complications can develop as mapping is required between the event stream and the end-of-event corresponding stream in order to associate an event with a respective end of duration event. Mapping and encoding this relationship between the event stream and the end of duration events can be complex and inefficient.

A time stamp typically includes a variable in the time domain that is associated with the event in which the variable represents duration. Duration represented by a variable in the time domain requires the entire duration to be defined with a start and an end for accurate representation of the duration for each event. This can lead to delay in aggregation of events since an event end must be identified while using a time stamp. For instance, suppose an event is issued whenever a person was born that has a duration until the person dies. It is beneficial to issue the event as soon as possible but the date of death is not known until much later. This forces a delay since the birth event will not issue until death occurs so that the duration is certain.

Moreover, difficulty arises in representing infinite events. The time stamp technique, as mentioned, requires the duration (e.g., a start and an end) in order to represent an event. In order to overcome the challenges with infinite duration events, time stamp techniques can provide an estimated duration (e.g., start and end for events) and, at a later time, updating the estimates. Yet, this leads to excess processing, increased delays, and inaccurate duration representation for events between updates.

SUMMARY

The following presents a simplified summary in order to provide a basic understanding of some aspects of the disclosed subject matter. This summary is not an extensive overview. It is not intended to identify key/critical elements or to delineate the scope of the claimed subject matter. Its sole purpose is to present some concepts in a simplified form as a prelude to the more detailed description that is presented later.

Briefly described, the subject disclosure generally pertains to modeling and employing events with duration. More specifically, an inner event stream can be generated to represent duration of an event from an outer event stream. By employing the inner event stream, an event duration can be accurately represented for the outer event stream. The inner event stream can include a start of duration and a duration end in which the period between the start of duration and the duration end is a duration for the event. Generating a corresponding event stream for each event on the outer event stream allows the outer event stream to be modeled for representation of event duration. Moreover, the modeled event stream can be utilized to identify coincidence, or, in other words, where the duration of two events overlaps. Furthermore, the modeled event stream can be employed with various operators to determine coincidence.

To the accomplishment of the foregoing and related ends, certain illustrative aspects of the claimed subject matter are described herein in connection with the following description and the annexed drawings. These aspects are indicative of various ways in which the subject matter may be practiced, all of which are intended to be within the scope of the claimed subject matter. Other advantages and novel features may become apparent from the following detailed description when considered in conjunction with the drawings.

DETAILED DESCRIPTION

Details below are generally directed toward modeling events with duration. It can be desirable to express queries as a coincidence of events. For example, suppose a query checks when two people are in the room at the same time. Conventionally, streams are composed of point events (e.g., events that occur at a particular time) that require the two people to enter the room at exactly the same moment in time for coincidence to be determined. This is extremely unlikely and incorrectly captures the intent of the query. The above situation can be addressed by changing from a notion of point events to events with duration. With this model of events, the event of a person entering a room includes a duration equal to the time the person is in the room. If two events overlap in time then the events are coincident. Herein details are provided pertaining to how to model events with duration. By way of example, and not limitation, an additional event stream can be generated that represents duration for a corresponding event. Additionally, a number of operations can be built that exploit events with duration (e.g., "GroupJoin," "Join," "Window," "BufferWithTime," "CombineLatest," "BufferWithCount" . . . ).

Various aspects of the subject disclosure are now described in more detail with reference to the annexed drawings, wherein like numerals refer to like or corresponding elements throughout. It should be understood, however, that the drawings and detailed description relating thereto are not intended to limit the claimed subject matter to the particular form disclosed. Rather, the intention is to cover all modifications, equivalents, and alternatives falling within the spirit and scope of the claimed subject matter.

Figure 1:
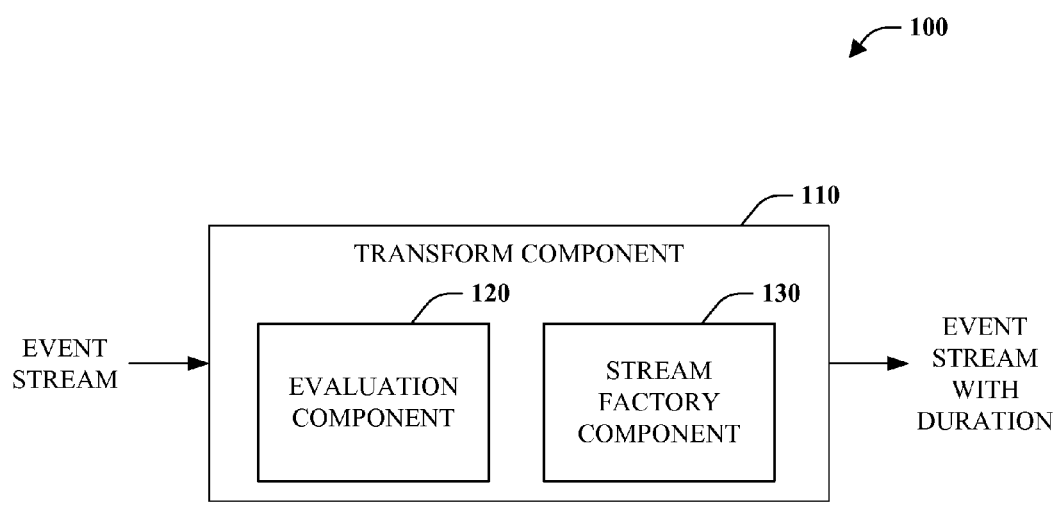
FIG. 1 is a block diagram of an event modeling system.

Referring initially to FIG. 1, an event modeling system 100 is illustrated that generates an event stream to represent duration of an event. The event modeling system 100 includes a transform component 110 that receives an outer event stream and outputs an event stream with duration (e.g., modeled event stream). In particular, the transform component 110 creates a model of an outer event stream in which the model includes an inner event stream for at least one event from the outer event stream, wherein the inner event stream represents duration of the at least one event. In other words, the transform component 110 represents duration with an additional event stream (e.g., inner event stream(s)) for each event. It is to be appreciated that the event can be, for example, a point event. Moreover, it is to be appreciated and understood that the outer event stream can be a source of streaming events while the inner event stream is created for each event on the outer event stream to represent duration for each respective event. In other words, there can be any suitable number of inner event streams to represent duration for each point on an outer event stream.

The transform component 110 further includes an evaluation component 120 that identifies events within the outer event stream. For example, a data source can provide a stream of events (e.g., outer event stream) in which the evaluation component 120 identifies each event within the event stream. In addition, the evaluation component 120 can receive and/or collect the outer event stream in order to provide analysis for event identification.

Furthermore, the transform component 110 includes a stream factory component 130 that creates additional event streams (e.g., inner event streams) to represent event duration for at least one event. The stream factory component 130 generates an inner event stream for at least one event from the outer event stream in order to represent duration. Particularly, the stream factory component 130 can create the inner event stream for at least one event based at least in part upon the evaluation component 120 identification of the at least one event. It is to be appreciated that the stream factory component 130 can generate an event stream (e.g., an inner event stream) for any suitable number of events from an outer event stream in order to model duration.

By way of example and not limitation, an outer event stream "A" can include events "W," "X," "Y" and "Z." The outer event stream "A" can be transformed from an event stream of point events to an event stream with duration (e.g., modeled event stream) by creating an additional event stream (e.g., inner event stream) for each event, wherein each additional stream corresponds to duration for each event. Thus, for the outer event stream "A," the following additional event streams (e.g., inner event streams) are generated to represent duration: an inner event stream "w" for event "W" (inner event stream "w" represents duration of event "W"); an inner event stream "x" for event "X" (inner event stream "x" represents duration of event "X"); an inner event stream "y" for event "Y" (inner event stream "y" represents duration of event "Y"); and an inner event stream "z" for event "Z" (inner event stream "z" represents duration of event "Z").

The stream factory component 130 further manages duration of the inner event stream. Generally, duration for an event includes a start and an end. Thus, in order to model event streams with duration, the stream factory component 130 creates the inner event stream that includes a start and an end. By way of example and not limitation, durations can have values and terminations. Yet, the stream factory component 130 utilizes the start and the duration end and any information in-between may or may not be maintained by the second event stream.

By utilizing the identification of events from the evaluation component 120, the stream factory component 130 executes the generation of the inner event stream at a start of the event represented. In other words, a start duration of an event is accurately represented by the inner event stream generated based upon the evaluation component 120. For instance, if event "X" is identified in event stream "A," the stream factory component 130 is triggered to generate the inner event stream "x" to represent the duration of event "X."

The stream factory component 130 can further include a duration end for a represented event. It is to be appreciated that a duration end can be, for example, a completion of a message for the at least one event (e.g., end), or any message sent (e.g., first message received from the outer event stream upon creation of the inner event stream) for the at least one event. Furthermore, it is to be appreciated that a duration end can transition between using the completion of a message or any message sent. It is to be appreciated that an event stream with completion messages is utilized correlated with the generated inner event streams to denote duration end.

By employing an inner event stream to represent duration for at least one event from an outer event stream, events and respective duration are modeled. Moreover, such modeling by the transform component 110 does not require estimates for duration, updates to correct estimates for duration, or event stream encoding or mapping—all of which are required for alternative techniques such as time stamps and end of duration events.

Figure 2:
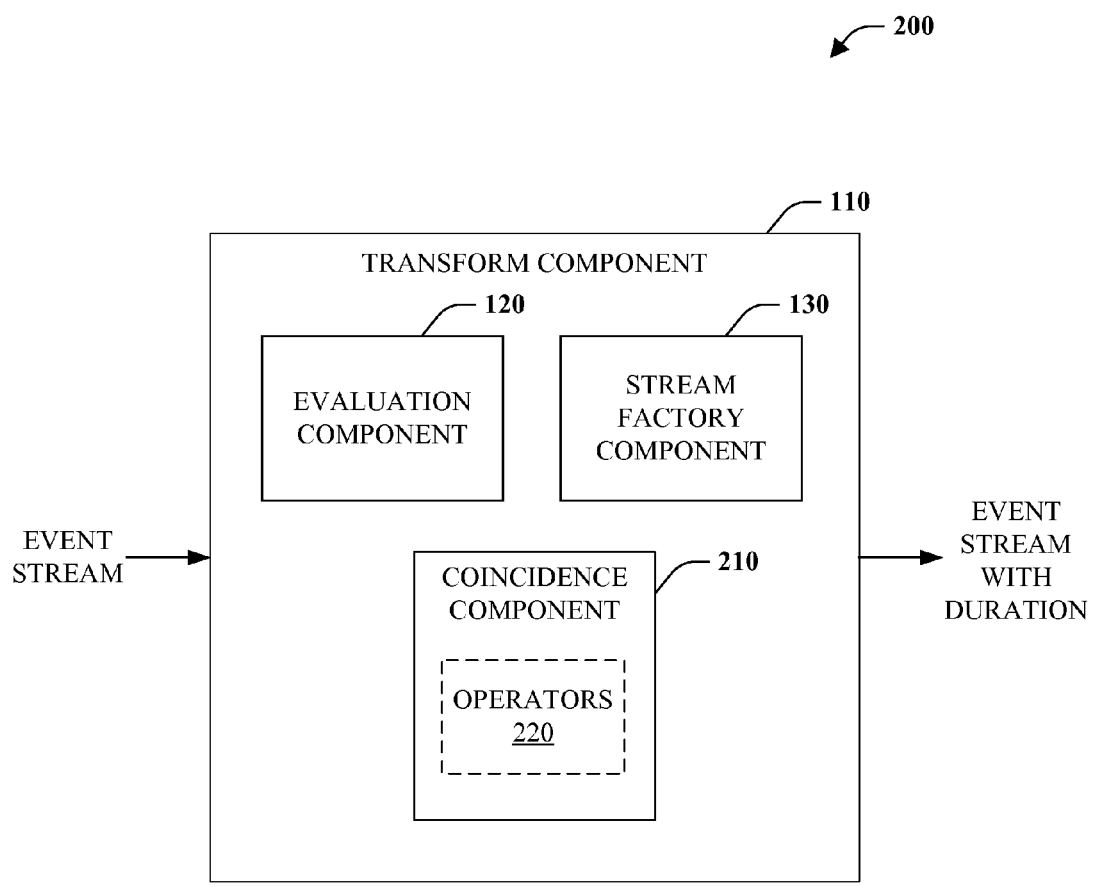
FIG. 2 is a block diagram of a modeling event system that represents duration for a point event within an event stream.

FIG. 2 illustrates a modeling event system 200 that represents duration for a point event within an event stream. The modeling event system 200 includes the transform component 110 that converts an event stream with point events to an event stream with duration. Specifically, the transform component 110 generates an inner event stream that corresponds to duration for at least one event from an outer event stream. In other words, the transform component 110 models the outer event stream with an inner event stream in order to accurately depict duration of at least one event such as a point event from the outer event stream.

The transform component 110 includes the evaluation component 120 and the stream factory component 130. The evaluation component 120 can monitor the outer event stream to detect at least one event. Based upon such detection, the stream factory component 130 can create an inner event stream for at least one event from the outer event stream, wherein the inner event stream represents duration (e.g., a start, an end) of the at least one event. As discussed above, the stream factory component 130 can generate any suitable number of event streams (e.g., inner event streams) for any suitable number of events on the outer event stream. For instance, the outer event stream can include $event_1$ to $event_N$, where "N" is a positive integer. In such an instance, the stream factory component 130 can inject an inner event stream$_1$ to an inner event stream$_N$, where "N" is a positive integer and inner event stream$_1$ represents duration for event$_1$ and an inner event stream$_N$ represents duration for event$_N$.

The transform component 110 further includes a coincidence component 210. The coincidence component 210 exploits the modeled event stream to determine overlap between a first event and a second event (e.g., coincidence). In other words, the coincidence component 210 utilizes the outer event stream and the inner event stream representing duration for at least one event in order to facilitate satisfying a coincidence query with respect to one or more event streams. As mentioned above, coincidence is a duration in which a first event overlaps with a duration of second event or a set of events. Stated differently, coincidence identifies a commonality between tables of data, wherein in the tables of data are, for instance, event streams, and the commonality is the two events that overlap. For instance, if an event stream is people entering and exiting a room, coincidence can be seen as when more than one person is in the room at the same time.

Further included with the coincidence component 210 are operators 220. Operators 220 can deal with coincidence and enable a query to be executed on event streams to return results related by coincidence. By way of example and not limitation, the operators 220 can be "GroupJoin," "Join," "Window," "BufferWithTime," "CombineLatest," "BufferWithCount" (discussed in more detail below).

In general, the operators 220 can include a number of useful operators that deal with coincidence. "Merge" and "Switch" are two operators that deal with coincidence and can be adapted to the modeled event stream since both operate on streams of streams which can be viewed as events with duration. In fact, another operator "MergeUntil" can be adapted to employ the modeled event stream and use coincidence information to delay "Switch" operations until duration expires.

Moreover, the operators 220 deal explicitly with coincidence. In each operator, it is possible to define the operator based on explicit streams of streams, but usually users will first map streams into this form. Therefore, the system 200 defines operators on a flat stream and provides a selector from the event type to a duration as follows:
Stream of Streams: IObservable<T x, IObservable<U>>, wherein an "IObservable<T>" is turned into the above given a selector "Func<T, IObservable<U>>."

Figure 3:
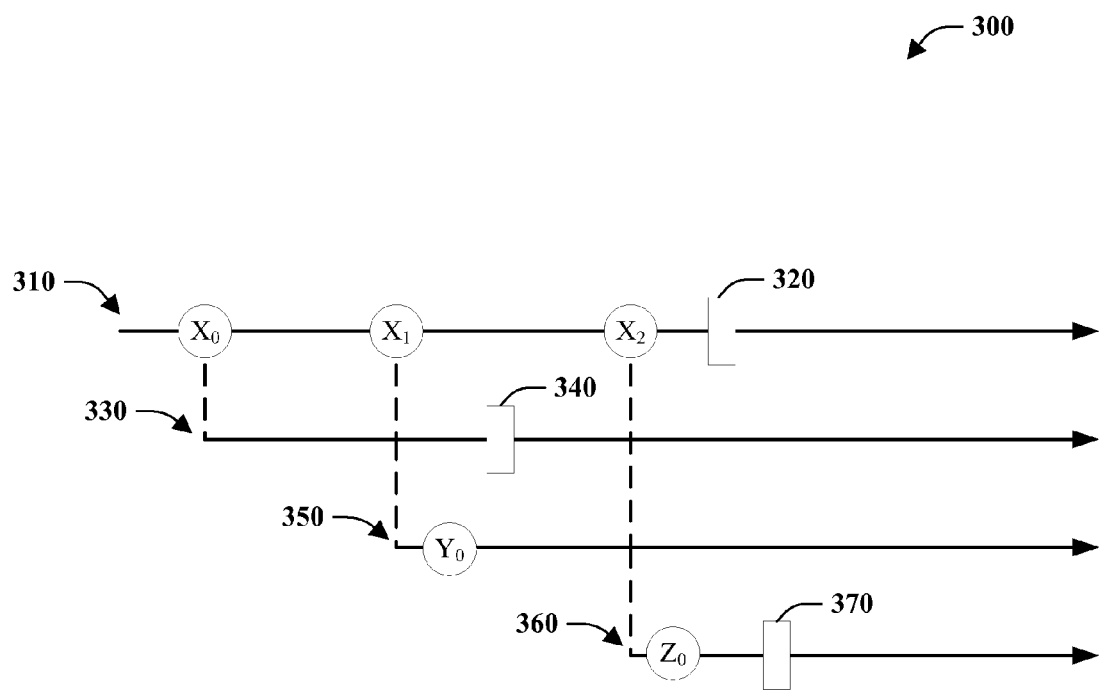
FIG. 3 depicts a modeled event stream that includes a representation of duration.

FIG. 3 illustrates a modeled event stream 300 that includes a representation of duration. In general, the subject disclosure creates an additional event stream (e.g., inner event stream) for at least one event from an outer event stream, wherein the additional event stream represents duration for a particular event. The modeled event stream 300 includes an outer event stream 310 that includes at least one event. Here, the outer event stream 310 (also referred to as "X") includes events "$X_0$," "$X_1$," and "$X_2$." The outer event stream 310 further includes an end 320 (e.g., termination) that corresponds to the end of the outer event stream communicated events (e.g., end of transform component receiving events from the outer event stream). It is to be appreciated that the outer event stream 310 can be, but is not limited to being, an event stream with point events.

As discussed in detail above, an event stream can be transformed to an event stream with duration by injecting additional event streams (e.g., inner event stream) to represent duration for events. An inner event stream 330 is generated based upon the event "$X_0$," wherein the inner event stream 330 will represent the duration of the event "$X_0$." The inner event stream 330 has a duration that begins upon communication of "$X_0$" from the outer event stream until an end 340.

An additional inner event stream 350 is created based upon the event "$X_1$" in order to represent the duration of the event "$X_1$." It is to be appreciated that the duration of the additional inner event stream 350 is from "$X_1$" to "$Y_0$," where "$Y_0$" is at least one of a completion of a message for the "$X_1$" (e.g., end), or any message sent (e.g., first message received from the outer event stream 310 upon creation of the additional inner event stream 350) for "$X_1$." It is to be appreciated that an end represented by a rectangle bar (e.g., end 320, end 340, end 370, etc.) corresponds to a duration end that is a completion of a message. Yet, "$Y_0$" is a duration end that is a message sent from the outer event stream 310 upon creation of the additional inner event stream 350.

An additional inner event stream 360 is created for the event "$X_2$" in which the duration thereof is represented. The duration of the event "$X_2$" is from "$X_2$" to an end 370. It is to be appreciated that "$Z_0$" can be at least one value (e.g., message) associated with the event "$X_2$." "$Z_0$" is depicted in order to illustrate a message received with event "$X_2$" on the additional inner event stream 360 as well as a duration end that is a completion of a message (e.g., represented by a rectangle bar).

In terms of coincidence within FIG. 3, "$X_0$" is coincident with "$X_0$" and "$X_1$," "$X_1$" is coincident with "$X_0$" and "$X_1$," whereas "$X_2$" is only coincident with "$X_2$." It is to be appreciated that coincidence is reflexive and symmetric but not transitive. As utilized herein, self-coincidence will be omitted in the remainder of the subject disclosure.

The modeled event stream 300 uses higher-order streams. In other words, the duration becomes a future (e.g., an object acting as a proxy for a result not initially known) that will give the duration when it is available, wherein the future is itself an event stream. For example, a future, as utilized herein, relates to duration of an event represented by an event stream since the duration of such event is not initially known. Yet, the duration is computed based upon the duration end (as discussed above). Furthermore, the future (duration in this context) is unresolved in which the additional event stream will become resolved asynchronously, wherein the start duration can be receipt of an event and duration end can be at least one of a completion of a message for the event, or any message sent for the event. The modeled event stream is generated by modeling events with duration as event streams of event streams as follows:
IObservable<T x, IObservable<U>>

The above can lead to a number of useful operators on reactive streams such as "Join," "GroupJoin," "Window," and "BufferWithTime," "CombineLatest," and "BufferWithCount." IObservable is employed above. As utilized herein, it is to be appreciated that IObservable and IEnumerable can be viewed as interchangeable within the subject disclosure based on each having substantially similar pertinent features. Thus, the above can be as follows:
IEnumerable<T x, IEnumerable<U>>

The following illustrates using higher order first-class event streams to model events with duration. The type is an event stream with data of type "T" that has an event stream denoting the duration and the duration carries data of type "U," as follows:
xs=IObservable<T x, IObservable<U>>

The following enables mapping to either of the other two common representations as follows:

```
xs.Select((value, duration) => value), xs.SelectMany((value,
  duration) => duration)
// pair of event streams
xs.SelectMany((value, duration) =>
  Never.Until(duration).Concat(Defer(Return((value, time))))
// event stream with duration as time value
```

Duration can be modeled as an inner event stream where a first event or an end concludes the duration. Duration can be modeled as an inner event stream where either an event or the end of stream can signal the end of the duration. An implementation can then use events for the duration to carry information or simply use normal or abnormal termination.

Figure 4:
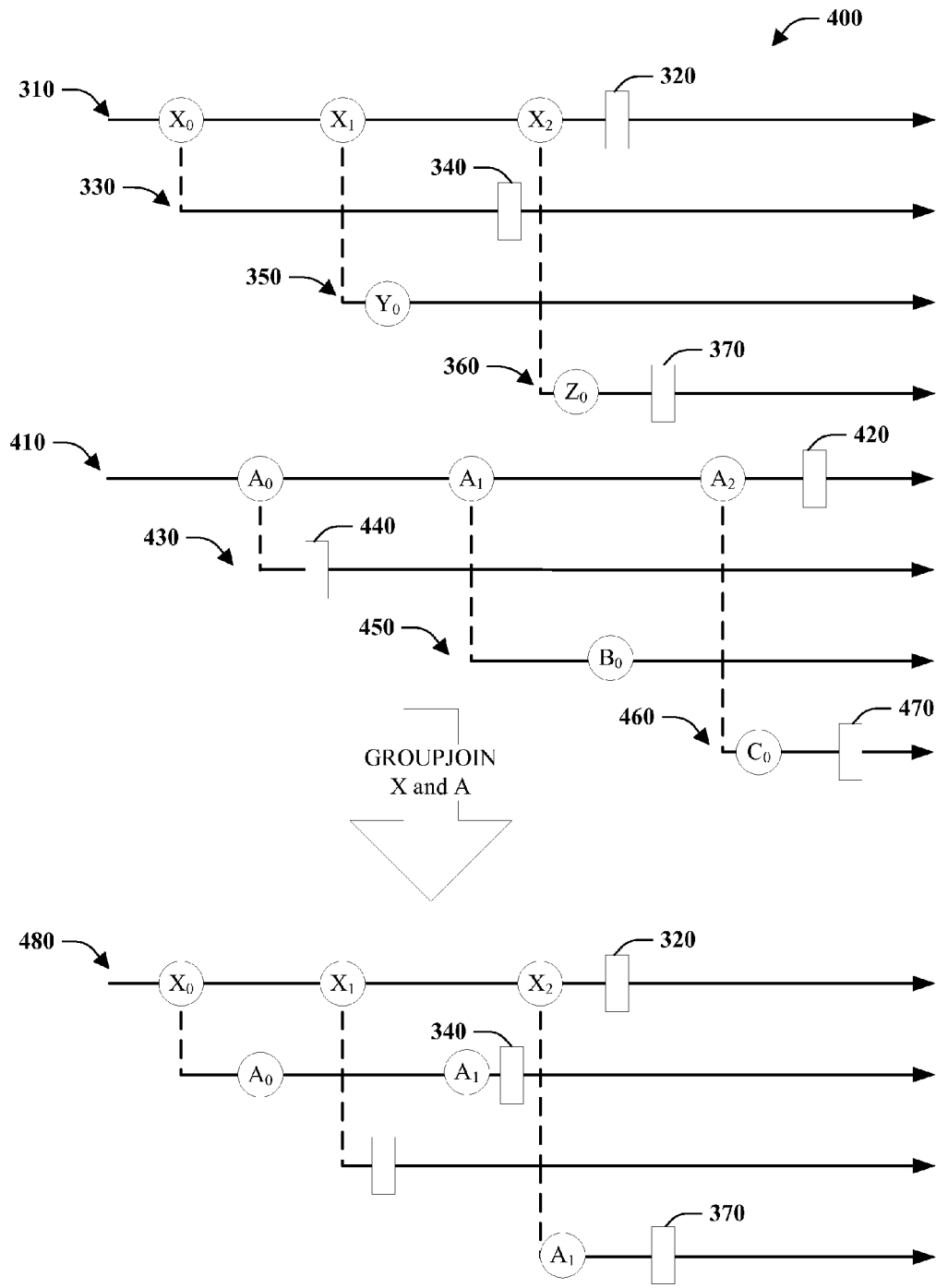
FIG. 4 depicts a coincidence operation on a first modeled event stream and a second modeled event stream.

FIG. 4 illustrates a coincidence operation 400 on a first modeled event stream and a second modeled event stream. The first modeled event stream includes the outer event stream 310 from FIG. 3 and is herein referred to as first modeled event stream 310. FIG. 4 depicts a coincidence operator "GroupJoin" executed between the first modeled event stream 310 and a second modeled event stream 410. The second modeled event stream 410 includes events "$A_0$," "$A_1$," and "$A_2$" with a termination (e.g., end) 420.

The event stream (also referred to as "A") having the events "$A_0$," "$A_1$," and "$A_2$" can be employed to generate the modeled event stream 410, as discussed above. In particular, an inner event stream 430 is generated to represent duration for event "$A_0$" (having an end 440), an additional inner event stream 450 is created to represent duration for event "$A_1$" (having an end "$B_0$" based on "$B_0$" being an event that terminates the duration), and an additional inner event stream 460 is generated to represent duration for event "$A_2$" (having an end 470). It is to be appreciated that "$C_0$" can be at least one value (e.g., message) associated with the event "$A_2$."

A "GroupJoin" operator determines coincidence between the first modeled event stream 310 (also referred to as "X") and the second modeled event stream 410 (also referred to as "A"). In terms of the first modeled event stream 310 and the second modeled event stream 410, "$X_0$" is coincident with "$A_0$" and "$A_1$," "$X_1$" is not coincident with any event, and "$X_2$" is coincident with "$A_1$." In general, the events that are coincident in the second modeled event stream 410 are projected onto the first modeled event stream 310. Executing the "GroupJoin" operator between the first modeled event stream 310 and the second modeled event stream 410 provides a resultant event stream 480. The resultant event stream 480 includes the coincident events from the second modeled event stream (e.g., "$A_0$" and "$A_1$") projected onto the first modeled event stream 310. In other words, "$A_0$" and "$A_1$" are projected onto the inner event stream 330 and "$A_1$" is projected onto the additional inner event stream 360.

The "GroupJoin" operator can be defined as follows:

```
IObservable<R> GroupJoin<T, U, TD, UD, R>(
  this IObservable<T> left,
  IObservable<U> right,
    Func<T, IObservable<TD>> leftDurationSelector,
    Func<U, IObservable<UD>> rightDurationSelector,
    Func<T, IObservable<U>, R> resultSelector)
```

"GroupJoin" can be the basis for other windowing operators. "GroupJoin" takes two streams as input as well as duration selectors for each stream. Whenever a new event occurs on the left stream, a window is opened and "leftDurationSelector" is invoked to determine the duration of the window. The window is closed whenever any message occurs on the duration. Also, when the window is opened the "resultSelector" is invoked with the value and the window to determine the next output in the result stream. The window can contain all currently open right source values as well as those which are open before the window is closed. Whenever a value occurs on the right source, then the value is sent to all currently open windows. The value is remembered until the time that the "rightDurationSelector" determines that the value should be removed. The result stream is sent an end of stream message whenever no new results can occur—which is when left stream is done. The windows are closed as already defined.

For example, executing a "GroupJoin:"

```
xs.GroupJoin(ys, x => duration(x), y => duration(y), (x, yy) => new {
x, yy })
```

It is to be appreciated that typical systems do not allow a duration for the right event stream. Additionally, "GroupJoin" can be expressed in terms of "Publish," "Select," and "TakeUntil."

The following illustrates that "GroupJoin" has a basic operation that maps the right source onto the durations of the left source until duration expires and projects the output:

```
xs.GroupJoin(ys, f, _ => Empty( ), h) == ys.Publish(ys1 => xs.Select(x
=> h(x, ys1.TakeUntil(f(x)))))
```

Additionally, the "GroupJoin" operator can be expressed with language syntax. Some languages like C#® and Visual Basic® supply syntax for "GroupJoin." For example, a given "GroupJoin:"
xs.GroupJoin(ys, f, g, h)
is equivalent to writing

```
from x in xs
  join y in ys on f(x) equals g(y) into results
  select h(x, results)
```

The syntax requires three expressions (ys, f(x), and g(y)) and two variable definitions (y and results). Typically, f(x) and g(y) are considered to be expressions that are used to compute whether two objects are equal and therefore should be joined. Yet, this can lead to the notion that the two expressions indicate duration and compute whether two objects are coincident and therefore should be joined. Thus, sources are "IObservables" and the key expressions are "IObservables."

Figure 5:
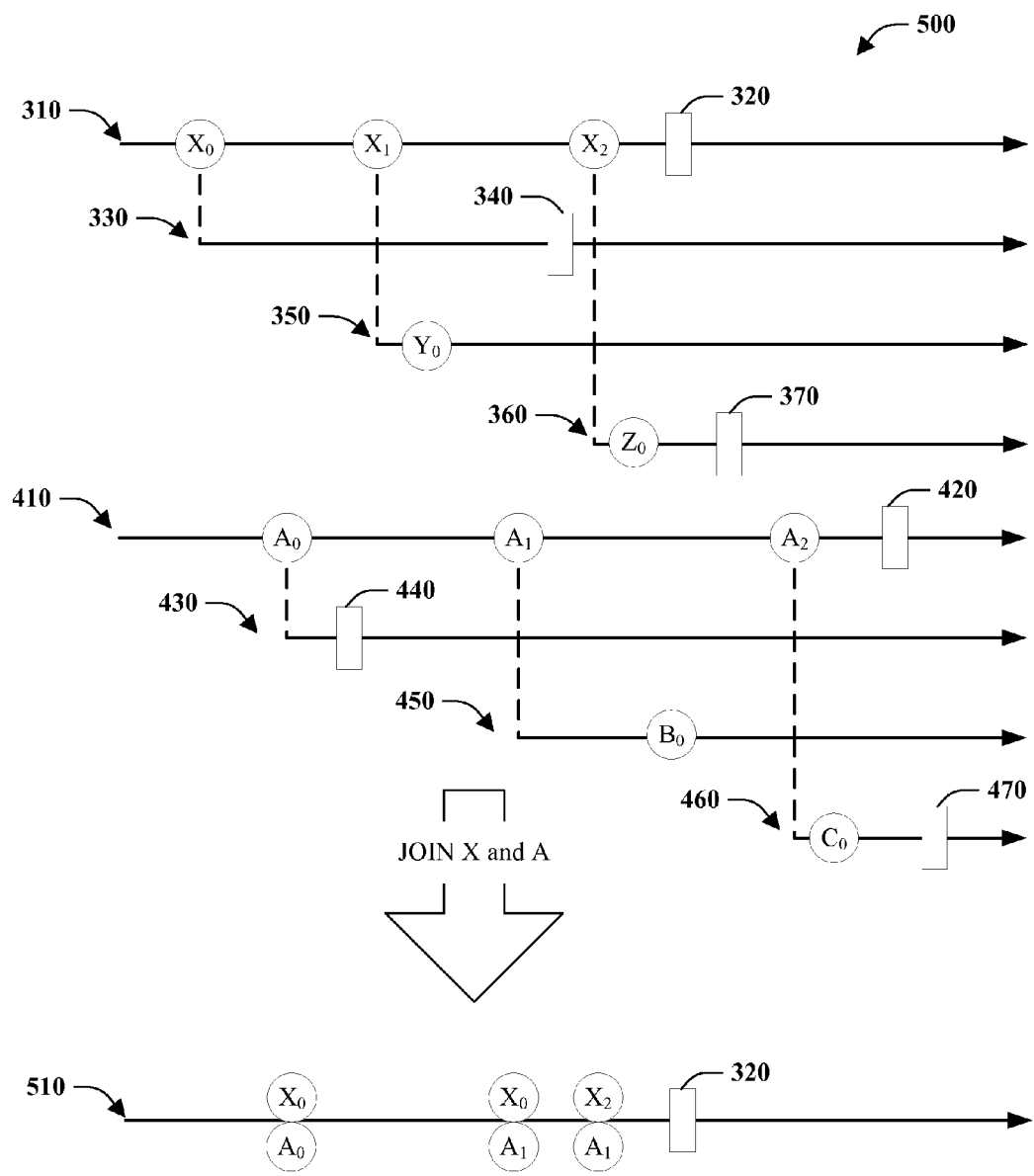
FIG. 5 depicts a coincidence operation on a first modeled event stream and a second modeled event stream.

FIG. 5 illustrates a coincidence operation 500 on a first modeled event stream and a second modeled event stream. The first modeled event stream includes the outer event stream 310 from FIG. 3 and FIG. 4 and is referred to first modeled event stream 310. Moreover, the second modeled event stream 410 is from FIG. 4. FIG. 5 depicts a coincidence operator "Join" executed between the first modeled event stream 310 and the second modeled event stream 410.

A "Join" operator determines coincidence between the first modeled event stream 310 (also referred to as "X") and the second modeled event stream 410 (also referred to as "A"). In terms of the first modeled event stream 310 and the second modeled event stream 410, "$X_0$" is coincident with "$A_0$" and "$A_1$," "$X_1$" is not coincident with any event, and "$X_2$" is coincident with "$A_1$." In general, the events that are coincident in the second modeled event stream 410 "paired up" and merged onto a resultant event stream 510 that includes the coincident events as point events. The resultant event stream 510 includes the coincident events from the second modeled event stream (e.g., "$A_0$" and "$A_1$") paired together as point events.

The "Join" operator can be defined as follows:

```
IObservable<R> Join<T, U, TD, UD, R>(
    this IObservable<T> left,
    IObservable<U> right,
    Func<T, IObservable<TD>> leftDurationSelector,
    Func<U, IObservable<UD>> rightDurationSelector,
    Func<T, U, R> resultSelector)
```

Join can be a special case of "GroupJoin" where coincident events are paired instead of using an entire window. In fact, "Join" can be defined in terms of "GroupJoin" as follows:

```
xs.Join(ys, f, g, r) == xs.GroupJoin(ys, f, g, (x, yy) => yy.Select(y
    => r(x, y))).Merge( )
```

Using the above definition, coincident events are paired and the results are merged together. The "Join" operator can be executed on the first modeled event stream 310 and the second modeled event stream 410 as follows:

xs.Join (ys, x=>duration (x), y=>duration (y), (x, y)=>new {x, y })

Thus, the pairings are depicted at the later of the two events since that is the earliest point at which the pairings are known to be coincident. It is to be appreciated that the outer stream now terminates later. The outer stream is terminated because this is the point at which there will be no further coincident events. However, a tighter bound can be employed in which the stream is terminated when either the left and all left durations have ended or when the right and all right durations have ended. In either case, it is known that no further combinations are possible. It is to be appreciated that this tighter bound is not expressed given our definition in terms of "GroupJoin."

The "Join" operator can be expressed with language syntax. Similar to GroupJoin, some languages like C#® and Visual Basic® supply syntax for "Join." For example:
xs.Join(ys, f, g, h)
is equivalent to writing

```
from x in xs
    join y in ys on f(x) equals g(y)
    select h(x, y)
```

The notion of key selector is changed to duration selector and equivalence to coincidence.

Figure 6:
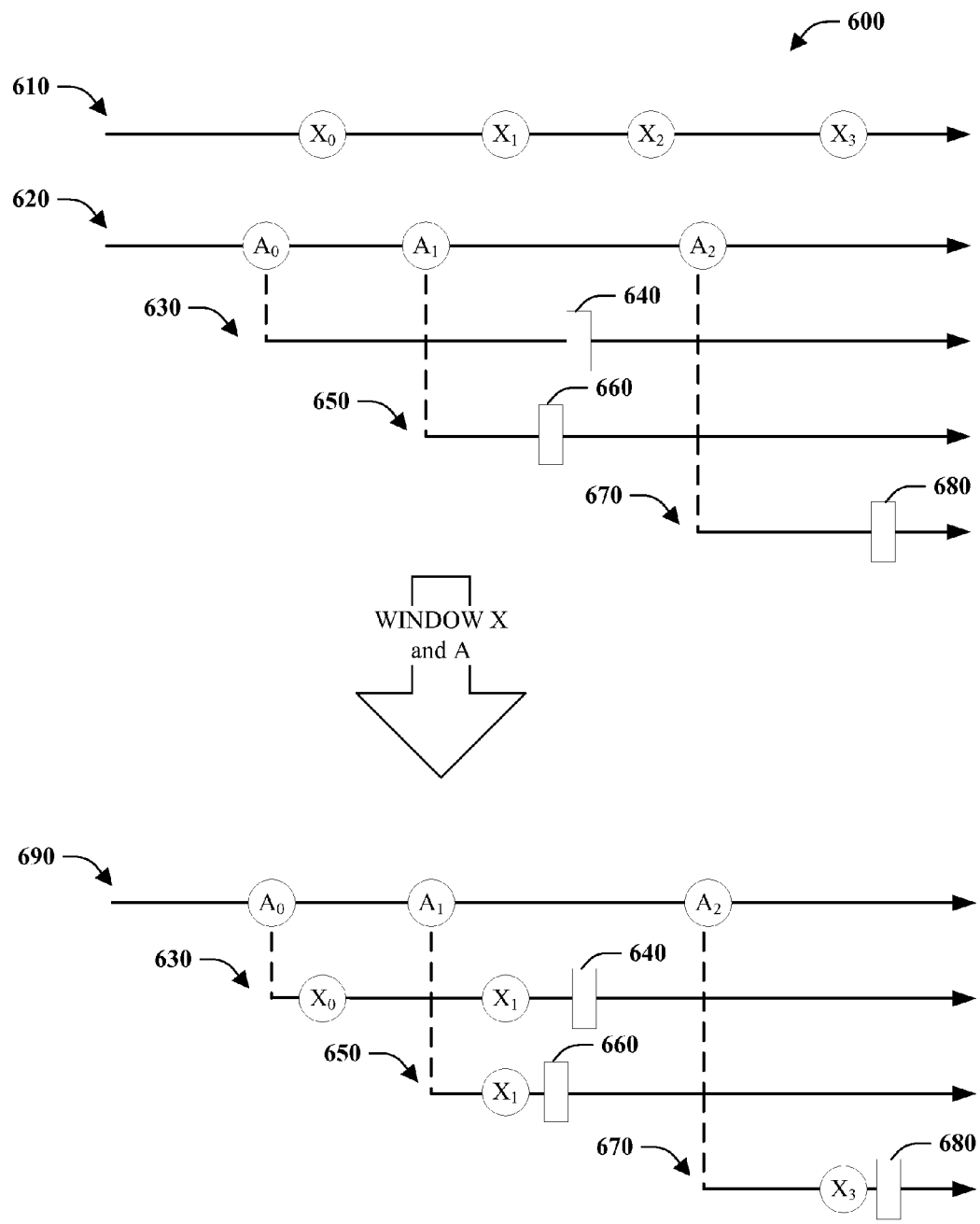
FIG. 6 depicts a coincidence operation on an event stream and a modeled event stream.

FIG. 6 illustrates a coincidence operation 600 on an event stream and a modeled event stream. The coincidence operation 600 includes a first event stream 610 (also referred to as "X") that includes events "$X_0$," "$X_1$," "$X_2$," and "$X_3$." It is to be appreciated that the first event stream 610 can be, for example, a data stream. The coincidence operation 600 further includes a modeled event stream 620 (also referred to as "A") that includes events "$A_0$," "$A_1$," and "$A_2$." The modeled event stream 620 (also referred to as the outer event stream) can include an inner event stream 630 (representative of duration for "$A_0$" with a termination 640), an additional inner event stream 650 (representative of duration for "$A_1$" with a termination 660), and an additional inner event stream 670 (representative of duration for "$A_2$" with a termination 680). It is to be appreciated that the events "$A_0$," "$A_1$," and "$A_2$" from the modeled event stream 620 can be windows in which to map events from the first event stream 610 (e.g., collect events "$X_0$," "$X_1$," "$X_2$," and/or "$X_3$" based on coincidence). Moreover, the additional event streams (e.g., inner event stream 630, additional inner event stream 650, and additional inner event stream 670) and respective durations can be defined in order to capture coincident events accordingly. In other words, the number of windows (e.g., additional event streams) as well as the duration of the windows can be, for example, user-defined via a query.

Therefore, executing the "Window" operator between the first event stream 610 and the modeled event stream 620 can provide a resultant modeled event stream 690. The resultant modeled event stream 690 includes the events from the first event stream 610 (also referred to as "X") mapped onto the modeled event stream 620 (also referred to as "A"). In terms of the first event stream 610 and the modeled event stream 620, "$A_0$" is coincident with "$X_0$" and "$X_1$," "$A_1$" is coincident with "$X_1$," and "$A_2$" is coincident with "$X_3$." Thus, the modeled event stream 690 includes "$X_0$" and "$X_1$" within the inner event stream 630, "$X_1$" within the additional inner event stream 650, and "$X_3$" within the additional inner event stream 670. In general, the window openings and closings are defined in which data (e.g., first event stream 610) is posted therein.

The "Window" operator can be defined as follows:

```
IObservable<IObservable<T>> Window<T, U, V>(
    this IObservable<T> data,
    IObservable<U> windowOpenings,
    Func<U, IObservable<V>> windowCloseSelector)
```

The "Window" operator can be defined to take a data stream and a window defining stream. The data can be mapped onto the defined windows. This can be substantially similar to the "GroupJoin variation" that is defined in terms of "Select" and "TakeUntil." Therefore, "Window" can be defined in terms of "GroupJoin" as follows:
xs.Window(ys, f)==ys.GroupJoin(xs, f, x=>Empty( ) (_, xx)=>xx)
With a given data stream and a stream of windows, the results can be the data stream mapped onto the defined windows.

The "BufferWithTime" operator can be defined as follows:

```
IObservable<IObservable<T>> BufferWithTime<T>(
    this IObservable<T> data,
    TimeSpan shift,
    TimeSpan span,
    IScheduler scheduler)
```

Windowing can be based on time. For example, time can be windowed based on a size of the window in time and a time shift to the next window. It is to be appreciated that this "BufferWithTime" operator can be defined in terms of the "Window" operator (as discussed above). "BufferWithTime" creates windows at "shift" with duration of "span." With "BufferWithTime," the data stream is not dictating windows (although the data stream can be used to drive the windows as discussed below). For example:

```
xs.BufferWithTime(shift, span, scheduler) == xs.Window(Timer(0,
  shift, scheduler), _ => Timer(span, scheduler))
```

Furthermore, data dependent data operators can be employed with the subject disclosure. The data dependent operators can be, but are not limited to, "CombineLatest" and "BufferWithCount."

Data-dependent "Joins" can be self-joins. Since reactive streams are any self join, the stream itself can be broadcast to appropriately share data. This can be done by using "Publish." For example, the self join can be as follows:

```
xs.Publish(xs1 => xs1.Join(xs1, durationSelector, durationSelector,
  (x1, x2) => new { x1, x2 })
```

A number of interesting combinators can be modeled. For instance, "CombineLatest" or "CombineLatestLeft" (e.g., CombineLatest but replaces_=>ys1 with_=>Empty( )) is illustrated as follows:

```
xs.CombineLatest(ys, f) == Publish(xs, ys, (xs1, ys1) =>
  xs1.Join(ys1, _ => xs1, _ => ys1, f))
```

Thus, "CombineLatest" can be a defined as a data-driven Windowing operator. The "CombineLatest" operator can replicate a latch in hardware in which the latest values on both streams are identified. This allows the definition of "BufferWithCount" as a data-driven Windowing operator as follows:

```
xs.BufferWithCount(n, m) == xs.Publish(xs1 =>
  xs1.Window(xs1.Select((x, i) => i).Where(i => i % m == 0), _ =>
  xs1.Skip(n - 1)))
```

IObservable is employed in the above examples. However, it is to be appreciated that IEnumerable can be employed as well. In other words, IObservable and IEnumerable can be seen as interchangeable within the subject disclosure.

The aforementioned systems, architectures, environments, and the like have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component to provide aggregate functionality. The components may also interact with one or more other components not specifically described herein for the sake of brevity, but known by those of skill in the art.

Furthermore, as will be appreciated, various portions of the disclosed systems above and methods below can include or consist of artificial intelligence, machine learning, or knowledge or rule-based components, sub-components, processes, means, methodologies, or mechanisms (e.g., support vector machines, neural networks, expert systems, Bayesian belief networks, fuzzy logic, data fusion engines, classifiers . . . ). Such components, inter alia, can automate certain mechanisms or processes performed thereby to make portions of the systems and methods more adaptive as well as efficient and intelligent. By way of example and not limitation, the transform component 110 or one or more sub-components thereof can employ such mechanisms to efficiently determine or otherwise infer generating additional event streams to a first stream in order to represent duration for at least one event on the first event stream.

Figure 7:
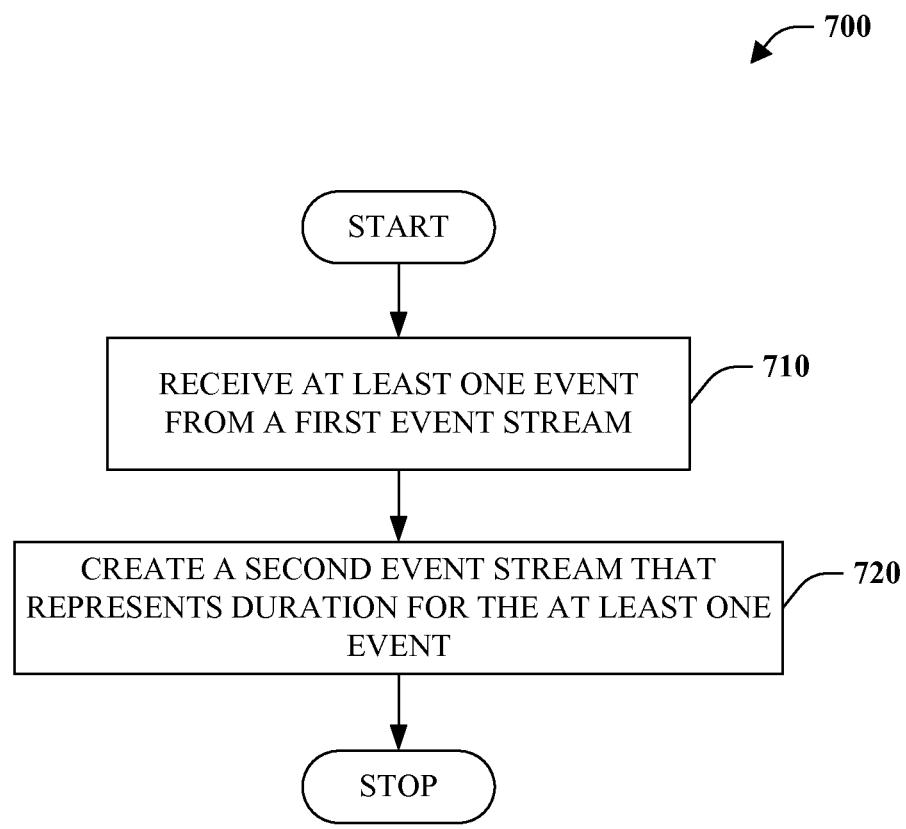
FIG. 7 is a flow chart diagram of a method creating an event stream for a point event to represent duration.
Figure 8:
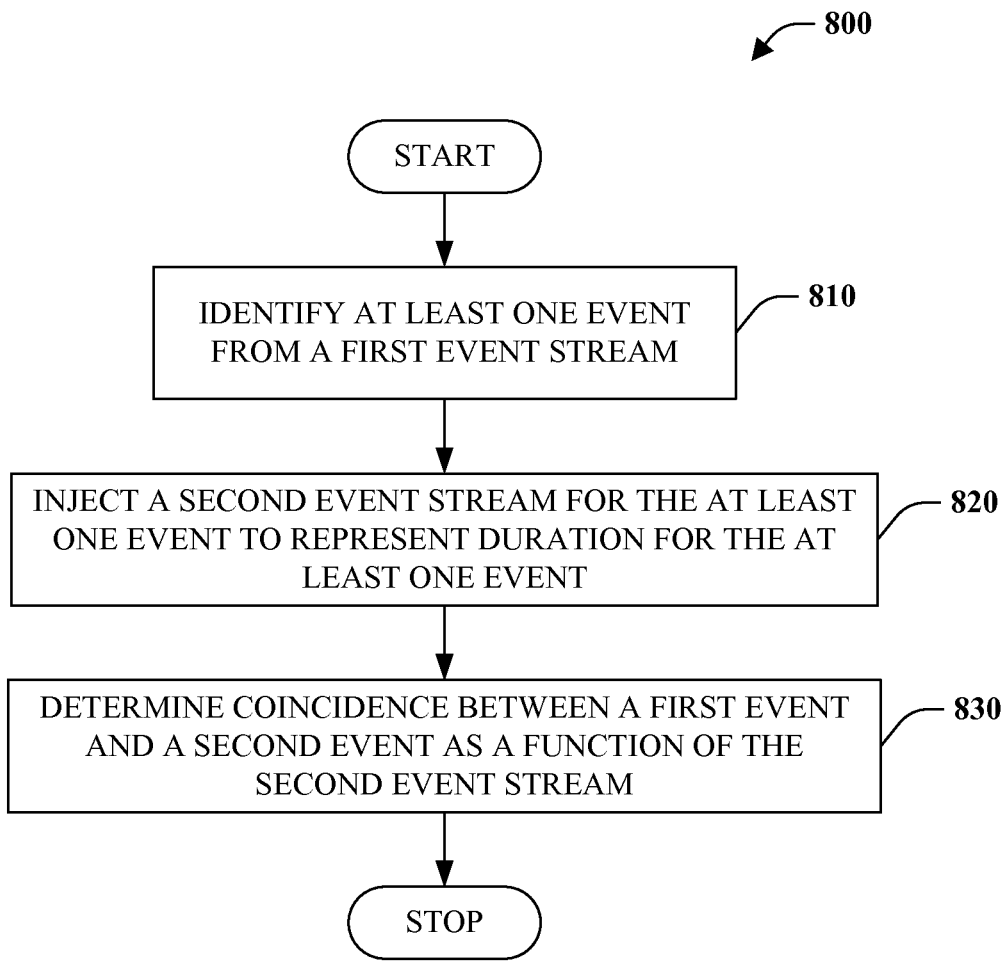
FIG. 8 is a flow chart diagram of a method exploiting a modeled event stream with duration to ascertain coincidence between events.

In view of the exemplary systems described supra, methodologies that may be implemented in accordance with the disclosed subject matter will be better appreciated with reference to the flow charts of FIGS. 7-8. While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

FIG. 7, a method of creating an event stream for a point event to represent duration 700 is illustrated. At reference numeral 710, at least one event from an outer event stream is received. By way of example and not limitation, the event from the outer event stream can be a point event. At reference numeral 720, an inner event stream that represents duration for the at least one event is created. In general, the outer event stream that includes at least one event is transformed (e.g., exploiting the created inner event stream to represent duration) to an event stream with duration(s). The inner event stream can be an additional event stream created for each event in order to correspond to duration for each event. By way of example and not limitation, an outer event stream can include events "A," "B," and "C" in which the following additional event streams are created: an inner event stream "A'" to represent duration for point event "A;" an inner event stream "B'" to represent duration for point event "B;" and an inner event stream "C'" to represent duration for point event "C."

FIG. 8 depicts a method of exploiting a modeled event stream with duration to ascertain coincidence between events 800. At reference numeral 810, at least one event from an outer event stream is identified. At reference numeral 820, an inner event stream for the at least one event is injected to represent duration for the at least one event. The inner event stream can be injected upon the start of the at least one event from the first event stream. By way of example and not limitation, an event "A" can be streamed from an outer event stream in which an inner event stream can be created (e.g., started) based upon the streaming from the outer event stream. Furthermore, it is to be appreciated that a corresponding additional event stream (e.g., inner event stream) can be injected for two or more events in order to represent duration for such events on the outer event stream. By representing the duration of the at least one event with the injected inner event stream, duration is accurately represented for events that have finite or infinite duration. By way of example and not limitation, an infinite duration event can include an injected event stream, wherein the injected event stream can be infinite in order to represent the infinite duration of the infinite duration event.

At reference numeral 830, coincidence is determined between a first event and a second event as a function of the inner event stream. As discussed, coincidence is a duration in which a first event overlaps with a duration of a second event or a set of events on an event stream. More generally, coincidence identifies a commonality between tables of data, wherein in the tables of data are, for instance, event streams, and the commonality is the two events overlap. By way of example and not limitation, coincidence between a first event and a second event can be ascertained by exploiting an operator such as "GroupJoin," "Join," "Window," "BufferWithTime," "CombineLatest," "BufferWithCount," and the like. By utilizing the transformed event stream (e.g., the outer event stream with an injected inner event stream to represent a duration of at least one event), operators can be employed to identify coincidence.

As used herein, the terms "component" and "system," as well as forms thereof are intended to refer to a computer-related entity, either hardware, a combination of hardware and software, software, or software in execution. For example, a component may be, but is not limited to being, a process running on a processor, a processor, an object, an instance, an executable, a thread of execution, a program, and/or a computer. By way of illustration, both an application running on a computer and the computer can be a component. One or more components may reside within a process and/or thread of execution and a component may be localized on one computer and/or distributed between two or more computers.

The word "exemplary" or various forms thereof are used herein to mean serving as an example, instance, or illustration. Any aspect or design described herein as "exemplary" is not necessarily to be construed as preferred or advantageous over other aspects or designs. Furthermore, examples are provided solely for purposes of clarity and understanding and are not meant to limit or restrict the claimed subject matter or relevant portions of this disclosure in any manner. It is to be appreciated a myriad of additional or alternate examples of varying scope could have been presented, but have been omitted for purposes of brevity.

As used herein, the term "inference" or "infer" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the claimed subject matter.

Furthermore, to the extent that the terms "includes," "contains," "has," "having" or variations in form thereof are used in either the detailed description or the claims, such terms are intended to be inclusive in a manner similar to the term "comprising" as "comprising" is interpreted when employed as a transitional word in a claim.

Figure 9:
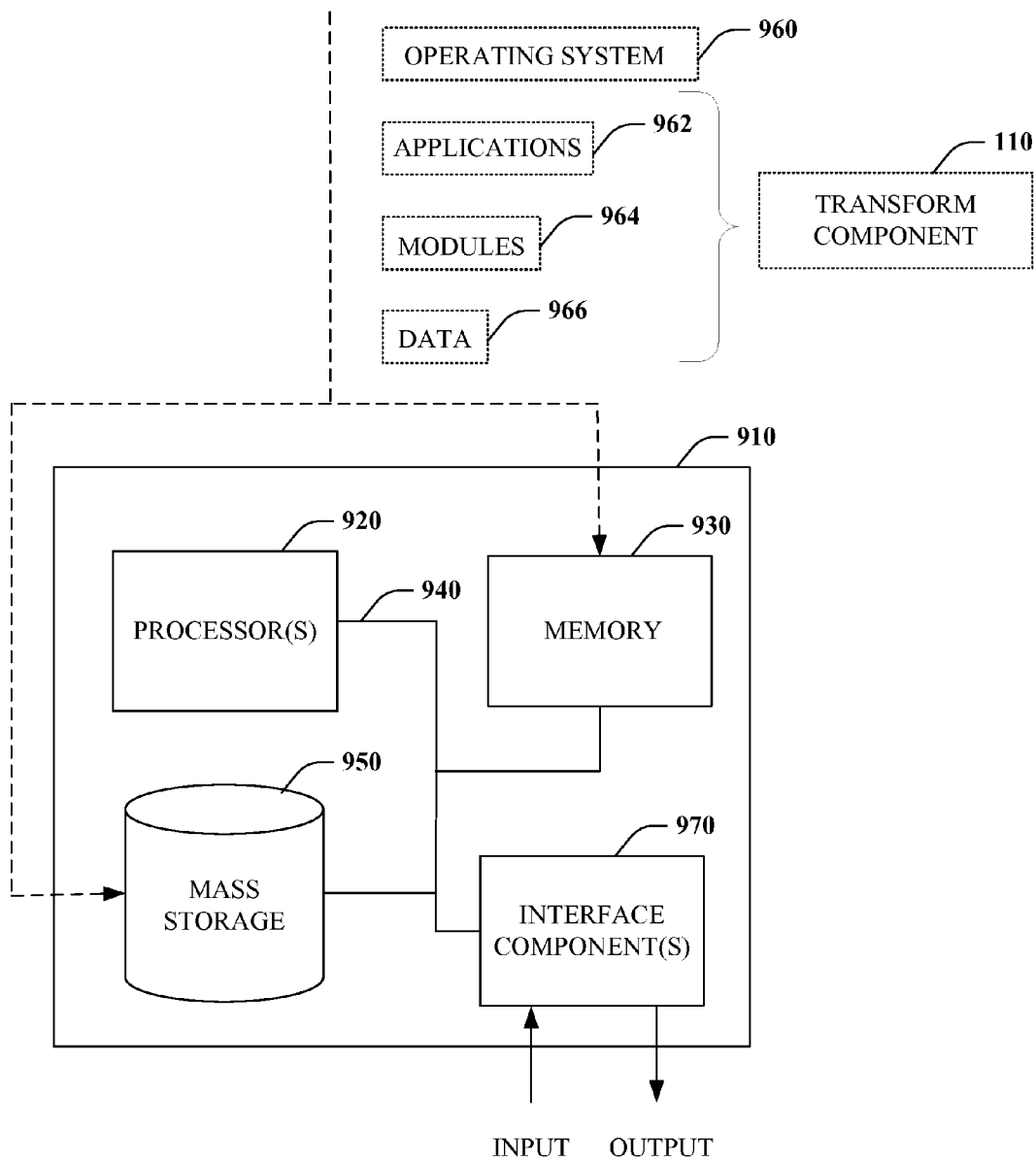
FIG. 9 is a schematic block diagram illustrating a suitable operating environment for aspects of the subject disclosure.

In order to provide a context for the claimed subject matter, FIG. 9 as well as the following discussion are intended to provide a brief, general description of a suitable environment in which various aspects of the subject matter can be implemented. The suitable environment, however, is only an example and is not intended to suggest any limitation as to scope of use or functionality.

While the above disclosed system and methods can be described in the general context of computer-executable instructions of a program that runs on one or more computers, those skilled in the art will recognize that aspects can also be implemented in combination with other program modules or the like. Generally, program modules include routines, programs, components, data structures, among other things that perform particular tasks and/or implement particular abstract data types. Moreover, those skilled in the art will appreciate that the above systems and methods can be practiced with various computer system configurations, including single-processor, multi-processor or multi-core processor computer systems, mini-computing devices, mainframe computers, as well as personal computers, hand-held computing devices (e.g., personal digital assistant (PDA), phone, watch . . . ), microprocessor-based or programmable consumer or industrial electronics, and the like. Aspects can also be practiced in distributed computing environments where tasks are performed by remote processing devices that are linked through a communications network. However, some, if not all aspects of the claimed subject matter can be practiced on stand-alone computers. In a distributed computing environment, program modules may be located in one or both of local and remote memory storage devices.

With reference to FIG. 9, illustrated is an example general-purpose computer 910 or computing device (e.g., desktop, laptop, server, hand-held, programmable consumer or industrial electronics, set-top box, game system . . . ). The computer 910 includes one or more processor(s) 920, memory 930, system bus 940, mass storage 950, and one or more interface components 970. The system bus 940 communicatively couples at least the above system components. However, it is to be appreciated that in its simplest form the computer 910 can include one or more processors 920 coupled to memory 930 that execute various computer executable actions, instructions, and or components.

The processor(s) 920 can be implemented with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. The processor(s) 920 may also be implemented as a combination of computing devices, for example a combination of a DSP and a microprocessor, a plurality of microprocessors, multi-core processors, one or more microprocessors in conjunction with a DSP core, or any other such configuration.

The computer 910 can include or otherwise interact with a variety of computer-readable media to facilitate control of the computer 910 to implement one or more aspects of the claimed subject matter. The computer-readable media can be any available media that can be accessed by the computer 910 and includes volatile and nonvolatile media and removable and non-removable media. By way of example, and not limitation, computer-readable media may comprise computer storage media and communication media.

Computer storage media includes volatile and nonvolatile, removable and non-removable media implemented in any method or technology for storage of information such as computer-readable instructions, data structures, program modules, or other data. Computer storage media includes, but is not limited to memory devices (e.g., random access memory (RAM), read-only memory (ROM), electrically erasable programmable read-only memory (EEPROM) . . . ), magnetic storage devices (e.g., hard disk, floppy disk, cassettes, tape . . . ), optical disks (e.g., compact disk (CD), digital versatile disk (DVD) . . . ), and solid state devices (e.g., solid state drive (SSD), flash memory drive (e.g., card, stick, key drive . . . ) . . . ), or any other medium which can be used to store the desired information and which can be accessed by the computer 910.

Communication media typically embodies computer-readable instructions, data structures, program modules, or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Memory 930 and mass storage 950 are examples of computer-readable storage media. Depending on the exact configuration and type of computing device, memory 930 may be volatile (e.g., RAM), non-volatile (e.g., ROM, flash memory . . . ) or some combination of the two. By way of example, the basic input/output system (BIOS), including basic routines to transfer information between elements within the computer 910, such as during start-up, can be stored in nonvolatile memory, while volatile memory can act as external cache memory to facilitate processing by the processor(s) 920, among other things.

Mass storage 950 includes removable/non-removable, volatile/non-volatile computer storage media for storage of large amounts of data relative to the memory 930. For example, mass storage 950 includes, but is not limited to, one or more devices such as a magnetic or optical disk drive, floppy disk drive, flash memory, solid-state drive, or memory stick.

Memory 930 and mass storage 950 can include, or have stored therein, operating system 960, one or more applications 962, one or more program modules 964, and data 966. The operating system 960 acts to control and allocate resources of the computer 910. Applications 962 include one or both of system and application software and can exploit management of resources by the operating system 960 through program modules 964 and data 966 stored in memory 930 and/or mass storage 950 to perform one or more actions. Accordingly, applications 962 can turn a general-purpose computer 910 into a specialized machine in accordance with the logic provided thereby.

All or portions of the claimed subject matter can be implemented using standard programming and/or engineering techniques to produce software, firmware, hardware, or any combination thereof to control a computer to realize the disclosed functionality. By way of example and not limitation, the transform component 110 can be, or form part of, an application 962, and include one or more modules 964 and data 966 stored in memory and/or mass storage 950 whose functionality can be realized when executed by one or more processor(s) 920, as shown.

In accordance with one particular embodiment, the processor(s) 920 can correspond to a system-on-a-chip (SOC) or like architecture including, or in other words integrating, both hardware and software on a single integrated circuit substrate. Here, the processor(s) 920 can include one or more processors as well as memory at least similar to processor(s) 920 and memory 930, among other things. Conventional processors include a minimal amount of hardware and software and rely extensively on external hardware and software. By contrast, an SOC implementation of processor is more powerful, as it embeds hardware and software therein that enable particular functionality with minimal or no reliance on external hardware and software. For example, the transform component 110, and/or associated functionality can be embedded within hardware in a SOC architecture.

The computer 910 also includes one or more interface components 970 that are communicatively coupled to the system bus 940 and facilitate interaction with the computer 910. By way of example, the interface component 970 can be a port (e.g., serial, parallel, PCMCIA, USB, FireWire . . . ) or an interface card (e.g., sound, video . . . ) or the like. In one example implementation, the interface component 970 can be embodied as a user input/output interface to enable a user to enter commands and information into the computer 910 through one or more input devices (e.g., pointing device such as a mouse, trackball, stylus, touch pad, keyboard, microphone, joystick, game pad, satellite dish, scanner, camera, other computer . . . ). In another example implementation, the interface component 970 can be embodied as an output peripheral interface to supply output to displays (e.g., CRT, LCD, plasma . . . ), speakers, printers, and/or other computers, among other things. Still further yet, the interface component 970 can be embodied as a network interface to enable communication with other computing devices (not shown), such as over a wired or wireless communications link.

What has been described above includes examples of aspects of the claimed subject matter. It is, of course, not possible to describe every conceivable combination of components or methodologies for purposes of describing the claimed subject matter, but one of ordinary skill in the art may recognize that many further combinations and permutations of the disclosed subject matter are possible. Accordingly, the disclosed subject matter is intended to embrace all such alterations, modifications, and variations that fall within the spirit and scope of the appended claims.

What is claimed is:

1. A method comprising:
receiving a point event in a first event stream; and
creating, by a processor, a second event stream, nested within the first event stream, to represent duration of the point event in the first event stream, wherein creation of the second event stream represents start of the duration of the point event.

2. The method of claim 1 further comprises comparing the first event stream with a third event stream comprising and embedded fourth stream that represents duration of a second point event to identify coincidence between the point event and the second point event.

3. The method of claim 2 further comprises projecting at least one value from the third event stream onto the first event stream to identify coincidence.

4. The method of claim 2 further comprises matching at least one pair of values between the first event stream and the second event stream to identify coincidence, the pair of values include a value from the second event stream that is coincident with a value from the first event stream.

5. The method of claim 4 further comprises combining the at least one pair of values on a resultant event stream that represents coincidence.

6. The method of claim 1 further comprises:
employing the second event stream as a window to collect an event coincident with the second event stream;
comparing the second event stream with a third event stream; and
mapping a point event from the third event stream into the window based upon the event coincident with the second event stream.

7. A system comprising:
an evaluation component configured to identify a point event from an outer event stream; and
a stream factory component configured to generate an inner event stream, nested within the outer event stream, that represents duration of the point event, wherein at least one of the evaluation component or the stream factory component are computer-related structures comprising hardware or a combination of hardware and software.

8. The system of claim 7, the duration of the inner event stream includes a start of duration and a duration end.

9. The system of claim 8, the start of the duration for the inner event stream is based upon an identification of the point event from the outer event stream.

10. The system of claim 8, the duration end is based upon at least one of a completion of a message for the point event, or a first message received from the outer event stream upon creation of the inner event stream.

11. The system of claim 7 further comprising a coincidence component configured to ascertain coincidence that is an overlap of duration between two events.

12. The system of claim 11, the coincidence component implements an operator to identify the overlap, the operator is at least one of "GroupJoin,""Join," "Window," "BufferWithTime," "CombineLatest," or "BufferWithCount".

13. The system of claim 11, the coincidence component projects a point event onto the inner event stream if a duration of the point event overlaps with a duration of the inner event stream.

14. The system of claim 11, the coincidence component matches at least one pair of point events and merges the at least one pair on an event stream, the at least one pair of point events include a point event from the outer event stream that overlaps with a point event from a second outer event stream.

15. A method comprising:
receiving a point event in an outer event stream;
injecting, by a processor, an inner event stream for the point event within the outer event stream to represent duration of the point event, wherein creation of the inner event stream represents start of the duration of the point event; and
determining coincidence between a first point event and a second point event as a function of the inner event stream.

16. The method of claim 15 further comprises transforming the outer event stream that includes the point event to a modeled event stream with the inner event stream representing duration for the point event.

17. A computer-readable storage medium, not including communication media, having instructions stored thereon that enable at least one processor to perform a method upon execution, the method comprising:
receiving a point event in a first stream; and
creating, by a processor, a second event stream, nested within the first event stream, to represent duration of the point event in the first event stream, wherein creation of the second event stream represents start of the duration of the point event.

18. The computer-readable storage medium of claim 17, the method further comprises determining coincidence between two point events in the first event stream by comparing the second event stream with a third event stream that represents duration of a second point event.

* * * * *